United States Patent
Leisenheimer et al.

(10) Patent No.: US 12,352,831 B2
(45) Date of Patent: Jul. 8, 2025

(54) DUAL CURRENT MAGNETIC FIELD SENSOR

(71) Applicant: Infineon Technologies AG, Neubiberg (DE)

(72) Inventors: Stephan Leisenheimer, Deisenhofen (DE); Richard Heinz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 323 days.

(21) Appl. No.: 18/047,759

(22) Filed: Oct. 19, 2022

(65) Prior Publication Data

US 2024/0133981 A1    Apr. 25, 2024
US 2024/0230796 A9    Jul. 11, 2024

(51) Int. Cl.
*G01R 33/07* (2006.01)
*G01R 19/00* (2006.01)
*G01R 33/00* (2006.01)
*H01L 23/495* (2006.01)

(52) U.S. Cl.
CPC ....... *G01R 33/072* (2013.01); *G01R 19/0092* (2013.01); *G01R 33/0005* (2013.01); *G01R 33/0047* (2013.01); *G01R 33/077* (2013.01); *H01L 23/49503* (2013.01)

(58) Field of Classification Search
CPC .. G01R 33/072; G01R 33/00; G01R 19/0092; G01R 33/0035; G01R 33/0023; G01R 33/0017; G01R 31/3191; G01R 33/0005; G01R 33/077; G01B 7/004; G01C 17/38;

(Continued)

(56) References Cited

U.S. PATENT DOCUMENTS 5,694,103 A * 12/1997 Goodwin ............... G01R 21/08
                                                      336/178
2012/0126805 A1 * 5/2012 Ausserlechner ....... G01R 33/07
                                                      324/252

(Continued)

OTHER PUBLICATIONS

Current Sensors. Allegro MicroSystems, Inc., 11 pages. [Retrieved on Sep. 26, 2022 from https://www.allegromicro.com/en/products/sense/current-sensor-ics].

(Continued)

*Primary Examiner* — Jermele M Hollington
*Assistant Examiner* — Taqi R Nasir
(74) *Attorney, Agent, or Firm* — Harrity & Harrity, LLP (57) ABSTRACT

A current sensor arrangement includes a first conductor structure extending in a first direction and configured to carry a first current along the first direction; a second conductor structure extending in a second direction perpendicular to the first direction and configured to carry a second current along the second direction; and a magnetic field sensor arranged between the first conductor structure and the second conductor structure and configured to receive a first magnetic field produced by the first current and a second magnetic field produced by the second current. The first conductor structure and the second conductor structure overlap with the magnetic field sensor in a third direction that is perpendicular to the first and second directions. The magnetic field sensor includes a first sensor element sensitive to the first magnetic field and a second sensor element sensitive to the second magnetic field.

22 Claims, 6 Drawing Sheets

(58) Field of Classification Search
CPC ........ G06F 3/017; G06F 3/0346; G06F 3/012; H01L 23/49503
See application file for complete search history.

(56) References Cited

U.S. PATENT DOCUMENTS

2015/0061662 A1* 3/2015 Ausserlechner ... G01R 19/0092
 324/252
2020/0056910 A1* 2/2020 Strutz ................ G01R 33/0076

OTHER PUBLICATIONS

Shorman, "Techniques to Minimize Common-Mode Field Interference When Using Allegro Current Sensor ICs (ACS724/5 and ACS780/1)," Allegro MicroSystems, Inc., Oct. 7, 2019, 6 pages. [Retrieved on Sep. 26, 2022 from https://www.allegromicro.com/en/insights-and-innovations/technical-documents/hall-effect-sensor-ic-publications/techniques-minimize-common-mode-field-interference].
Milano, "Achieving Closed-Loop Accuracy in Open-Loop Current Sensors," Allegro MicroSystems, Inc., May 28, 2019, 6 pages. [Retrieved on Sep. 26, 2022 from https://www.allegromicro.com/en/insights-and-innovations/technical-documents/hall-effect-sensor-ic-publications/techniques-minimize-common-mode-field-interference].

* cited by examiner

DUAL CURRENT MAGNETIC FIELD SENSOR

BACKGROUND

There are many applications in which measuring an electric current is desired. As one example, it may be desired to measure one or more electric currents of a battery system of an electric vehicle. In another example, it may be desired to measure one or more electric currents provided to a load, such as an electric motor. In yet further examples, it may be desired to measure one or more electric currents of a power distribution system or one or more electric currents in a circuit.

Because an electric current flowing through a current-carrying conductor produces a magnetic field with a magnetic field flux density that is proportional to a magnitude of the electric current, magnetic field sensors can be used as current sensors. By placing a magnetic field sensor near the current-carrying conductor, the magnetic field sensor can generate a measurable quantity, such as a voltage, that is proportional to the magnetic field sensed by the magnetic field sensor. However, it is noted that the magnetic field flux density in a space around the current-carrying conductor reduces significantly with distance from the current-carrying conductor. Therefore, a sensor element of the magnetic field sensor are placed in close proximity to the current-carrying conductor.

SUMMARY

In some implementations, a current sensor arrangement includes a first conductor structure extending in a first direction and configured to carry a first current along the first direction, wherein the first current produces a first magnetic field; a second conductor structure extending in a second direction perpendicular to the first direction, wherein the second conductor structure is configured to carry a second current along the second direction, and wherein the second current produces a second magnetic field; and a magnetic field sensor arranged between the first conductor structure and the second conductor structure and configured to receive the first magnetic field and the second magnetic field, wherein the first conductor structure and the second conductor structure overlap with the magnetic field sensor in a third direction that is perpendicular to both the first direction and the second direction, and wherein the magnetic field sensor includes a first sensor element sensitive to the first magnetic field and configured to generate a first sensor signal based on the first magnetic field and the magnetic field sensor further includes a second sensor element sensitive to the second magnetic field and configured to generate a second sensor signal based on the second magnetic field.

In some implementations, a current sensor arrangement includes a first conductor structure extending on a first axis and configured to carry a first current along the first axis, wherein the first current produces a first magnetic field; a second conductor structure extending on a second axis perpendicular to the first axis, wherein the second conductor structure is configured to carry a second current along the second axis, and wherein the second current produces a second magnetic field; and a magnetic field sensor arranged between the first conductor structure and the second conductor structure and configured to receive the first magnetic field and the second magnetic field, wherein the first conductor structure and the second conductor structure overlap with the magnetic field sensor along a third axis that is perpendicular to both the first axis and the second axis, and wherein the magnetic field sensor comprises a first sensor element sensitive to the first magnetic field and configured to generate a first sensor signal based on the first magnetic field and the magnetic field sensor further comprises a second sensor element sensitive to the second magnetic field and configured to generate a second sensor signal based on the second magnetic field.

In some implementations, a method for sensing a first current and a second current includes producing a first magnetic field by the first current flowing in a first conductor structure, wherein the first conductor structure extends along a first axis and is configured to carry the first current along the first axis; producing a second magnetic field by the second current flowing in a second conductor structure, wherein the second conductor structure extends along a second axis and is configured to carry the second current along the second axis; receiving the first magnetic field and the second magnetic field by a magnetic field sensor arranged between the first conductor structure and the second conductor structure, wherein the first conductor structure and the second conductor structure overlap with the magnetic field sensor along a third axis that is perpendicular to both the first axis and the second axis; generating a first sensor signal by a first sensor element of the magnetic field sensor, wherein the first sensor element is sensitive to the first magnetic field; and generating a second sensor signal by a second sensor element of the magnetic field sensor, wherein the second sensor element is sensitive to the second magnetic field.

BRIEF DESCRIPTION OF THE DRAWINGS

Implementations are described herein making reference to the appended drawings.

DETAILED DESCRIPTION

In the following, details are set forth to provide a more thorough explanation of example implementations. However, it will be apparent to those skilled in the art that these implementations may be practiced without these specific details. In other instances, well-known structures and devices are shown in block diagram form or in a schematic view rather than in detail in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top," "bottom," "below," "above," "front," "behind," "back," "leading," "trailing," etc., may be used with reference to an orientation of the figures being described. Because parts of the implementations, described herein, can be positioned in a number of different orientations, the directional terminology is used for purposes of illustration and is in no way limiting. It is to be understood that other implementations may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling, e.g., any connection or coupling without additional intervening elements, may also be implemented by an indirect connection or coupling, e.g., a connection or coupling with one or more additional intervening elements, or vice versa, as long as the general purpose of the connection or coupling, for example, to transmit a certain kind of signal or to transmit a certain kind of information, is essentially maintained. Features from different implementations may be combined to form further implementations. For example, variations or modifications described with respect to one of the implementations may also be applicable to other implementations unless noted to the contrary.

The terms "substantially" and "approximately" may be used herein to account for small manufacturing tolerances (e.g., within 5%) that are deemed acceptable in the industry without departing from the aspects of the implementations described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

A sensor may refer to a component which converts a property to be measured to an electric signal, for example, a current signal or a voltage signal. The property may, for example, comprise a magnetic field, an electric field, a pressure, a force, a current, or a voltage, but is not limited thereto. It will be appreciated that there are various sensor techniques for measuring current, as will be described below.

A magnetic field sensor, for example, is a semiconductor chip (e.g., a sensor chip) that includes one or more magnetic field sensor elements, referred herein as simply "sensor elements," that measure one or more characteristics of a magnetic field (e.g., an amount of magnetic field flux density, a field strength, a field angle, a field direction, a field orientation, etc.). A sensor element is configured to generate a sensor signal (e.g., a voltage) in response to one or more magnetic fields impinging on the sensor element. Thus, the sensor signal is indicative of a magnitude and/or the field orientation of at least one magnetic field impinging on the sensor element. The semiconductor chip may further include circuitry for processing and outputting one or more sensor signals generated by the one or more sensor elements.

The magnetic field may be produced by a magnet, a current-carrying conductor (e.g., a wire, a lead frame, or a busbar), the Earth, or another magnetic field source. A sensor element has a "sensitivity axis" or "sensing axis." The sensor element is sensitive to a magnetic field component of a magnetic field that is projected onto or aligned with the sensitivity axis. A magnetic field component may be, for example, an x-magnetic field component Bx, a y-magnetic field component By, or a z-magnetic field component Bz. The x-magnetic field component Bx and the y-magnetic field component By are aligned in-plane to the semiconductor chip and the z-magnetic field component Bz is aligned out-of-plane to the semiconductor chip in the examples provided herein.

Magnetic field sensors include magnetoresistive sensors and Hall-effect sensors (Hall sensors), for example. Magnetoresistance is a property of a material to change a value of its electrical resistance when an external magnetic field is applied to the material. Some examples of various magnetoresistive effects are Giant Magneto-Resistance (GMR), which is a quantum mechanical magnetoresistance effect observed in thin-film structures composed of alternating ferromagnetic and non-magnetic conductive layers; Tunnel Magneto-Resistance (TMR), which is a magnetoresistive effect that occurs in a magnetic tunnel junction (MTJ), which is a component including two ferromagnets separated by a thin insulator; or Anisotropic Magneto-Resistance (AMR), which is a property of a material in which a dependence of electrical resistance on an angle between a direction of electric current and a direction of magnetization is observed. For example, in the case of AMR sensors, a resistance for an AMR sensor element changes according to a square of a sine of an angle of the magnetic field component projected on the sensitivity axis of the ARM sensor element.

The various magnetoresistive effects are commonly abbreviated as xMR, where the "x" acts as a placeholder for the various magnetoresistive effects. xMR sensors can detect the field orientation of an applied magnetic field by measuring sine and cosine angle components with monolithically integrated magnetoresistive sensor elements.

Magnetoresistive sensor elements of such xMR sensors typically include a plurality of layers, of which at least one layer is a reference layer with a reference magnetization (i.e., a reference direction). The reference magnetization provides a sensing direction that defines the sensitivity axis of a magnetoresistive sensor element. This generally means that the sensitivity axis of the magnetoresistive sensor element is parallel to a chip plane defined by a main surface of the semiconductor chip in which the magnetoresistive sensor element is integrated. As such, the magnetoresistive sensor element is sensitive to the magnetic field component that extends parallel to, or in-plane with, the main surface of the semiconductor chip. Accordingly, if a magnetic field component points exactly in a same direction with respect to the reference direction, a resistance of the magnetoresistive sensor element is at a maximum and, if the magnetic field component points exactly in the opposite direction with respect to the reference direction, the resistance of the magnetoresistive sensor element is at a minimum.

As a result, the resistance or a voltage drop across the magnetoresistive sensor element resulting from the resistance is proportional to the magnetic field and can be used as the sensor signal of the magnetoresistive sensor element. Moreover, in some applications, an xMR sensor includes a plurality of magnetoresistive sensor elements, which may have the same or different reference magnetizations.

A Hall effect sensor, or "Hall sensor" for short, is a transducer that varies its output voltage (Hall voltage) in response to a magnetic field. It is based on a Hall effect which makes use of a Lorentz force. The Lorentz force deflects moving charges in a presence of the magnetic field which is perpendicular to a current flow through a sensor element (e.g., a Hall plate) of the Hall sensor. Thereby, the sensor element can be a thin piece of semiconductor material or metal. The deflection causes a charge separation which causes a Hall electrical field. This Hall electrical field acts on the charge in an opposite direction with regard to the Lorentz force. Both forces balance each other and create a potential difference perpendicular to a direction of current flow. The potential difference can be measured as the Hall voltage and varies in a linear relationship with the magnetic field.

There are generally two types of Hall sensors, including a vertical Hall sensor and a lateral Hall sensor. The vertical Hall sensor is a magnetic field sensor constructed with its sensor element arranged perpendicular to the chip plane defined by the main surface of the semiconductor chip. In particular, the sensor element of the vertical Hall sensor may be a conductive plate having a sensor plane that extends "vertically" from the main surface of the semiconductor chip into a chip body of the semiconductor chip. The sensitivity axis of the sensor element of the vertical Hall sensor is perpendicular to the sensor plane. This generally means that the sensor element of the vertical Hall sensor is sensitive to the magnetic field component that extends parallel to, or in-plane with, the main surface of the semiconductor chip in which the sensor element is integrated. For the sensor element of the vertical Hall sensor, a voltage value is output according to the magnetic field flux density in the direction of its sensitivity axis.

On the other hand, a lateral (planar) Hall sensor is constructed with a sensor element (e.g., a Hall plate) that has a sensor plane that is parallel to the chip plane defined by the main surface of the semiconductor chip. In particular, the sensor element of the lateral Hall sensor may be a conductive plate having the sensor plane that extends "laterally" along or in parallel to the main surface of the semiconductor chip. Since the sensitivity axis of the sensor element of the lateral Hall sensor is perpendicular to the sensor plane, this generally means that the sensor element of the lateral Hall sensor is sensitive to magnetic fields vertical, or out-of-plane, to the main surface of the semiconductor chip. For the sensor element of the lateral Hall sensor, a voltage value is output according to the magnetic field flux density in the direction of its sensitivity axis.

Magnetoresistive sensor elements and vertical Hall sensor elements may be used to measure magnetic fields parallel to the chip plane and lateral Hall sensor elements may be used to measure magnetic fields perpendicular to the chip plane. Two or more sensor elements and corresponding sensor circuitry may be accommodated (i.e., integrated) in a same semiconductor chip. The sensor circuitry may be referred to as a signal processing circuit and/or a signal conditioning circuit that receives one or more signals (e.g., sensor signals) from one or more sensor elements in the form of raw measurement data and derives, from the one or more signals, a measurement signal that represents the magnetic field. In some cases, the sensor circuitry may generate a differential measurement signal from the signals generated by two sensor elements having a same sensing axis (e.g., two sensor elements sensitive to a same magnetic field component) using differential calculus. A differential measurement signal provides robustness to homogenous external stray magnetic fields.

Signal conditioning, as used herein, refers to manipulating an analog signal in such a way that the signal meets requirements of a next stage for further processing. Signal conditioning may include converting from analog to digital (e.g., via an analog-to-digital converter), amplification, filtering, converting, biasing, range matching, isolation, or any other processes used to make a sensor output suitable for processing after conditioning.

Thus, the sensor circuitry may include an analog-to-digital converter (ADC) that converts the analog signal from the one or more sensor elements to a digital signal. The sensor circuitry may also include a digital signal processor (DSP) that performs some processing on the digital signal. Therefore, the semiconductor chip, which may also be referred to as an integrated circuit (IC), may include a circuit that conditions and amplifies the sensor signal of one or more sensor elements via signal processing and/or conditioning.

A system may include two current-carrying conductors that are spaced in close proximity to each other. The proximity of the two current-carrying conductors may make it difficult to independently measure the currents flowing through the two current-carrying conductors. For example, measuring both currents with shunts is possible but measuring the currents with the shunts is associated with undesired power losses. Meanwhile, measuring both currents with magnetic field sensors can be more power efficient compared to using the shunts, but can be difficult because of magnetic cross-talk resulting from the currents. Moreover, the magnetic field flux density in a space around each current-carrying conductor reduces significantly with distance from the current-carrying conductor. Therefore, each sensor element of a magnetic field sensor should be placed in close proximity to the current-carrying conductor targeted for measurement, which adds to the difficulty of obtaining two independent measurements of two currents flowing in close proximity of each other due to a potential for the magnetic cross-talk.

Accordingly, some implementations disclosed herein are directed to measuring two currents, flowing through two current-carrying conductors, independently using sensor elements integrated in a single magnetic field sensor. The two current-carrying conductors are arranged perpendicular to each other in a way that the two current-carrying conductors overlap each other in a region proximate to the single magnetic field sensor. As a result, the two currents flowing through the two current-carrying conductors generate independent magnetic fields with substantially zero magnetic cross-talk in the region proximate to the single magnetic field sensor. The single magnetic field sensor may include a first sensor element sensitive to a magnetic field produced by a first current of the two currents and a second sensor element sensitive to a magnetic field produced by a second current of the two currents. By integrating the first sensor element and the second sensor element into the single magnetic field sensor, both the first sensor element and the second sensor element can be placed sufficiently close to the two current-carrying conductors for sensing respective ones of the first current and the second current. This enables accurate sensing of both currents.

Figure 1A:
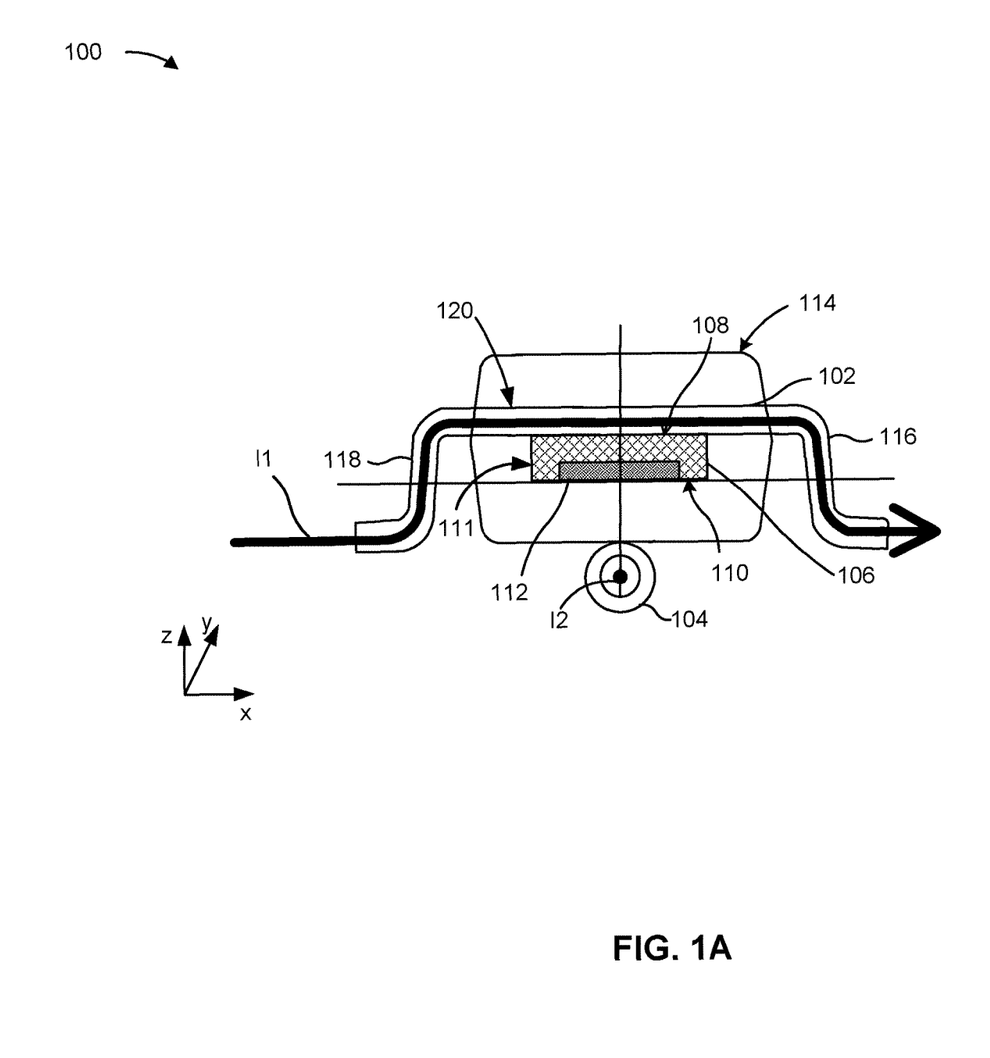
FIG. 1A is a cross-sectional view of a current sensor arrangement according to one or more implementations.

FIG. 1A is a cross-sectional view of a current sensor arrangement 100 according to one or more implementations. The current sensor arrangement 100 includes a first conductor structure 102, a second conductor structure 104, and a magnetic field sensor 106 that is arranged between the first conductor structure 102 and the second conductor structure 104. The first conductor structure 102 is configured to carry a first current I1 along a first direction of a first axis (e.g., an x-direction of an x-axis) and produces a first magnetic field B1, shown in FIGS. 1C-1E. Specifically, the first conductor structure 102 extends in the first direction along the first axis as the first axis extends past the magnetic field sensor 106. In this way, the first magnetic field B1 has a first field orientation relative to the magnetic field sensor 106. The second conductor structure 104 is configured to carry a second current I2 along a second direction of a second axis (e.g., a y-direction of a y-axis) and produces a second magnetic field B2, shown in FIGS. 1C-1E. Specifically, the second conductor structure 104 extends in the second direction along the second axis as the second axis extends past the magnetic field sensor 106. In this way, the second magnetic field B2 has a second field orientation relative to the magnetic field sensor 106.

It is noted that the first conductor structure 102 and the second conductor structure 104 are perpendicular to each other such that there is no, or substantially no, magnetic cross-talk between the first magnetic field B1 and the second magnetic field B2 at the magnetic field sensor 106. The magnetic field sensor 106 in this example is arranged between the first conductor structure 102 and the second conductor structure 104 and is configured to receive the first magnetic field B1 and the second magnetic field B2. The first conductor structure 102 and the second conductor structure 104 overlap with the magnetic field sensor 106 in a third direction along a third axis (e.g., a z-direction along a z-axis) that is perpendicular to both the first direction and the second direction. In other words, an "intersection point" of the first conductor structure 102 and the second conductor structure 104 is projected onto the magnetic field sensor 106, even though the first conductor structure 102 and the second conductor structure 104 do not actually intersect by physical contact. Stated differently, the first conductor structure 102 and the second conductor structure 104 overlap in the third direction with overlapping portions of the first conductor structure 102 and the second conductor structure 104 being arranged on a line (e.g., the z-axis) that bisects the magnetic field sensor 106.

The magnetic field sensor 106 is a semiconductor chip that has a first main surface 108 and a second main surface 110 arranged across a body 111 opposite to the first main surface 108. A magnetic field sensor 106 also includes a sensitive area 112 in which sensor elements are arranged. The sensitive area 112 may be arranged at one of the first main surface 108 or the second main surface 110 and extend into the body 111 of the magnetic field sensor 106. In this example, the sensitive area 112 is arranged at the second main surface 110 and extends into the body 111 from the second main surface 110. Additionally, the first conductor structure 102 is arranged in closer proximity to the first main surface 108 than to the second main surface 110. Meanwhile, the second conductor structure 104 is arranged in closer proximity to the second main surface 110 than to the first main surface 108. Having the magnetic field sensor 106 arranged between the first conductor structure 102 and the second conductor structure 104 ensures that the magnetic field sensor 106 is capable of measuring both the first magnetic field B1 and the second magnetic field B2. In other words, the magnetic field sensor 106 arranged between the first conductor structure 102 and the second conductor structure 104 ensures that the magnetic field flux densities of the first magnetic field B1 and the second magnetic field B2 are sufficient at a location of the magnetic field sensor 106 to be measured by the magnetic field sensor 106.

The first main surface 108 and the second main surface 110 define a chip plane of the magnetic field sensor 106 and the sensor elements are configured to sense one or more magnetic field components that are "in-plane" with the chip plane of the magnetic field sensor 106. For example, the chip plane in this example is defined by an x-y plane that is defined by the x-axis and the y-axis. Thus, "in-plane" magnetic field components may include an x-magnetic field component Bx and a y-magnetic field component By. The x-magnetic field component Bx and the y-magnetic field component By are perpendicular to each other with no, or substantially no, magnetic cross-talk.

The current sensor arrangement 100 may also include a chip package 114 that houses the magnetic field sensor 106 and includes a first lead 116, a second lead 118, and a lead frame 120. The first lead 116 and the second lead 118 may be two of a plurality of leads of the lead frame 120, where the first lead 116 is arranged at a first side of the chip package 114 and the second lead 118 is arranged at a second side of the chip package 114 that is opposite to the first side of the chip package 114. The first lead 116 and the second lead 118 are electrically coupled together by a conductive path of the lead frame 120 to form the first conductor structure 102. As a result, the first conductor structure 102 is integrated with the chip package 114 and a portion of the first conductor structure 102 passes through the chip package 114. The lead frame 120 may be mechanically coupled to the first main surface 108 of the magnetic field sensor 106 such that the first current I1 is carried in the first direction that is parallel to the first main surface 108 (e.g., parallel to the chip plane). For example, the lead frame 120 may include a die pad that is electrically coupled to the magnetic field sensor 106 and to the plurality of leads, where the die pad includes the conductive path that is electrically connected to the first lead 116 and the second lead 118.

The second conductor structure 104 may be arranged entirely external to the chip package 114 and extends past the magnetic field sensor 106 in the second direction perpendicular with the first direction, yet in parallel with the chip plane of the magnetic field sensor 106. For example, the second conductor structure 104 may be a printed circuit board (PCB) wire, a bonding wire, an external current rail, or another type of current-carrying conductor.

The second conductor structure 104 may be arranged in contact with the chip package 114. Therefore, the second current I2 is carried in the second direction that is parallel to the first main surface 108 (e.g., parallel to the chip plane).

As indicated above, FIG. 1A is provided merely as an example. Other examples are possible and may differ from what was described with regard to FIG. 1A. For example, in some implementations, an overlapped intersection of the first conductor structure 102 and second conductor structure 104 may be offset from the sensitive area 112 of the magnetic field sensor 106 or may be offset from the magnetic field sensor 106 itself to, for example, account for manufacturing tolerances or different manufacturing processes. In some implementations, the second conductor structure 104 may also pass through or be integrated with the chip package 114. In some implementations, the first conductor structure 102 may not pass through or be integrated with the chip package 114 to enable flexibility in system design or to enable flexibility in application of the magnetic field sensor 106. In some implementations, additional circuit components may be integrated within, or attached to, the current sensor arrangement 100 without deviating from the disclosure provided above.

Figure 1B:
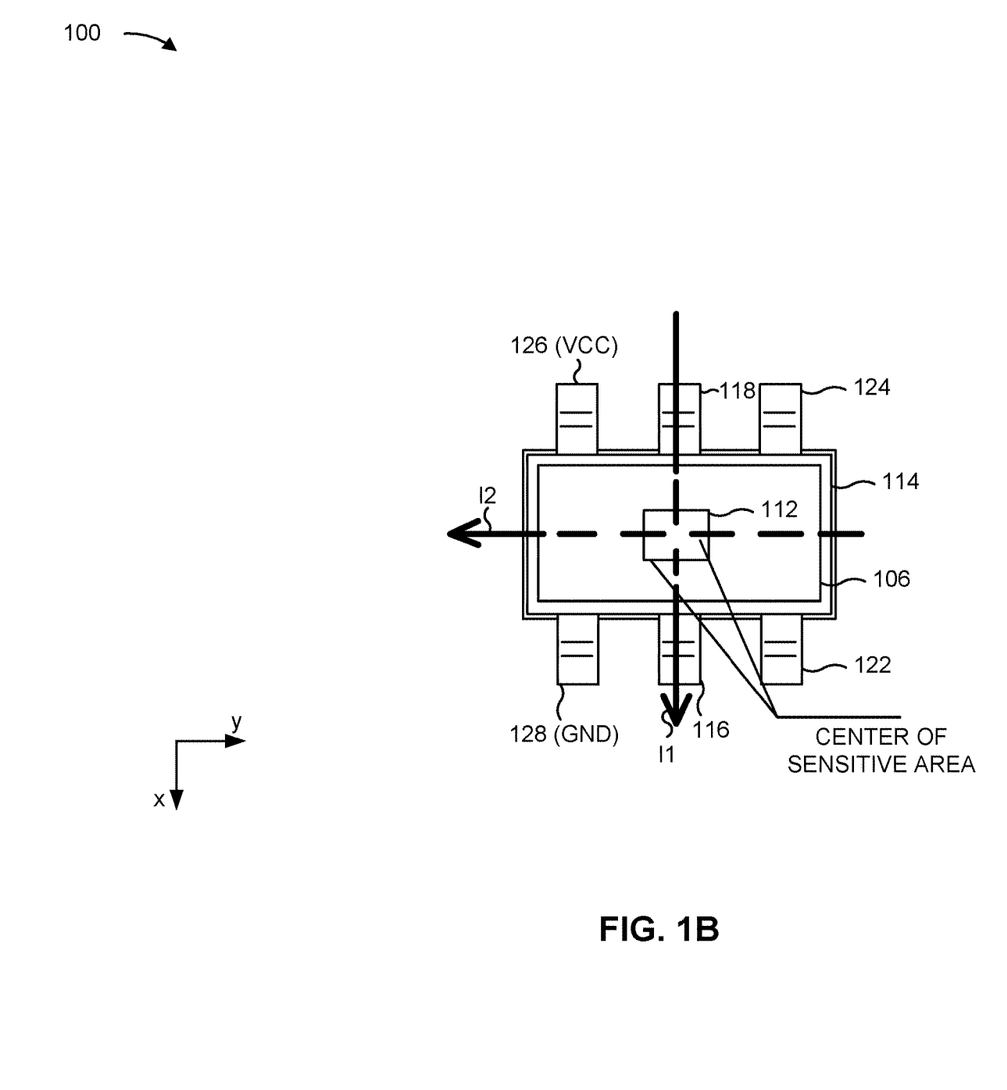
FIG. 1B is a plan view of the current sensor arrangement of FIG. 1A according to one or more implementations.

FIG. 1B is a plan view of the current sensor arrangement 100 according to one or more implementations. Here, the plurality of leads of the lead frame 120 are visible. The plurality of leads include first lead 116, the second lead 118, a third lead 122 that is electrically coupled to the magnetic field sensor 106 and configured to output a first sensor signal or a first measurement signal generated by the magnetic field sensor 106 and corresponding to the first magnetic field B1, a fourth lead 124 that is electrically coupled to the magnetic field sensor 106 and configured to output a second sensor signal or a second measurement signal generated by the magnetic field sensor 106 and corresponding to the second magnetic field B2, a fifth lead 126 that provides a first supply potential (e.g., a positive supply potential VCC) to the magnetic field sensor 106, and a sixth lead 128 that provides a second supply potential (e.g., ground GND) to the magnetic field sensor 106. The first conductor structure 102 and the second conductor structure 104 extend in perpendicularly directions relative to each other, with an overlap of the first conductor structure 102 and the second conductor structure 104 being arranged over the magnetic field sensor 106 along the third axis (e.g., the z-axis). It will be appreciated that FIG. 1B illustrates merely one or many examples of a lead configuration for the plurality of leads and represents one example of both a number of possible leads and a possible assignment to one or more chip inputs and one or more chip outputs for the plurality of leads. The lead configuration for plurality of leads is not limited to specific types of chip inputs, such as supply potentials, or chip outputs, such as signal outputs.

As indicated above, FIG. 1B is provided merely as an example. Other examples are possible and may differ from what was described with regard to FIG. 1B. For example, in some implementations, an overlapped intersection of the first conductor structure 102 and the second conductor structure 104 may be offset from the sensitive area 112 of the magnetic field sensor 106 or may be offset from the magnetic field sensor 106 itself. In some implementations, the chip package 114 may include more or fewer leads than is shown in FIG. 1B. In some implementations, additional circuit components may be integrated within, or attached to, the current sensor arrangement 100 without deviating from the disclosure provided above.

Figure 1C:
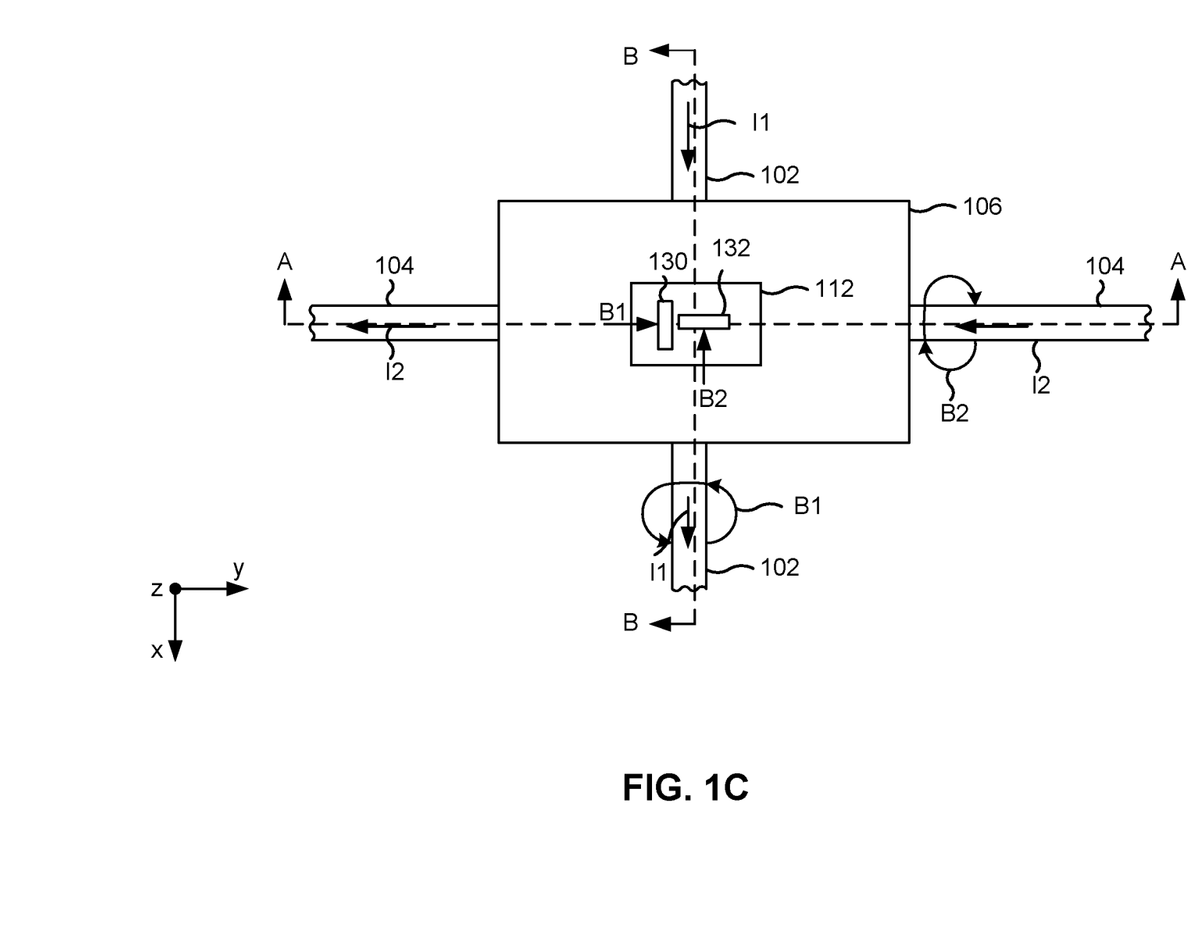
FIG. 1C is a plan view of a magnetic field sensor of the current sensor arrangement of FIG. 1A according to one or more implementations.

FIG. 1C is a plan view of the magnetic field sensor 106 of the current sensor arrangement 100 according to one or more implementations. A portion of the first conductor structure 102 that passes over top of the magnetic field sensor 106 has been removed from FIG. 1C in order to provide visibility to one or more components of the magnetic field sensor 106.

The magnetic field sensor 106 includes a first sensor element 130 that is sensitive to the first magnetic field B1 generated by the first current I1 flowing through the first conductor structure 102. The first sensor element 130 is configured to generate a first sensor signal based on the received first magnetic field B1.

The first sensor element 130 is sensitive to an in-plane magnetic field component (e.g., the y-magnetic field component By) of the first magnetic field B1. The first sensor element 130 may be a vertical Hall effect sensor element (e.g., a vertical Hall plate) that that has a first sensor plane that extends "vertically" from the second main surface 110 into the body 111 of the magnetic field sensor 106. In this example, the first sensor plane is defined by the x-axis and the z-axis. Generally, a sensitivity axis of a vertical Hall effect sensor element is perpendicular to the sensor plane, which means that the first sensor element 130 has a sensitivity axis aligned parallel with the y-axis (e.g., aligned parallel or antiparallel to the second direction). As a result, the first sensor element 130 is sensitive to the y-magnetic field component By of the first magnetic field B1 and is insensitive, or substantially insensitive, to the second magnetic field B2, which does not have a y-magnetic field component By.

Alternatively, the first sensor element 130 may be an xMR sensor element that has a sensitivity axis aligned parallel with the y-axis (e.g., aligned parallel or antiparallel to the second direction) to be sensitive to the y-magnetic field component By of the first magnetic field B1.

The first sensor element 130 may be electrically coupled to the third lead 122 for providing the first sensor signal thereto for output from the chip package 114. Alternatively, the magnetic field sensor 106 may include a sensor circuit that is coupled to the third lead 122. The sensor circuit may receive the first sensor signal, process the first sensor signal to generate the first measurement signal, and provide the first measurement signal to the third lead 122 for output from the chip package 114. Thus, the first measurement signal is derived from the first sensor signal.

The magnetic field sensor 106 further includes a second sensor element 132 that is sensitive to the second magnetic field B2 generated by the second current I2 flowing through the second conductor structure 104. The second sensor element 132 is configured to generate a second sensor signal based on the received second magnetic field B2. The second sensor element 132 is sensitive to an in-plane magnetic field component (e.g., the x-magnetic field component Bx) of the second magnetic field B2. The in-plane magnetic field component of the second magnetic field B2 to which the second sensor element 132 is sensitive is perpendicular to the in-plane magnetic field component of the first magnetic field B1 to which the first sensor element 130 is sensitive so that there is no, or substantially no, magnetic cross-talk.

The second sensor element 132 may be a vertical Hall effect sensor element (e.g., a vertical Hall plate) that has a second sensor plane that extends "vertically" from the second main surface 110 into the body 111 of the magnetic field sensor 106. In this example, the second sensor plane is defined by the y-axis and the z-axis. Accordingly, the first sensor plane of the first sensor element 130 and the second sensor plane of the second sensor element 132 are perpendicular to each other. Generally, a sensitivity axis of a vertical Hall effect sensor element is perpendicular to the sensor plane, which means that the second sensor element 132 has a sensitivity axis aligned parallel with the x-axis (e.g., aligned parallel or antiparallel to the first direction). As a result, the second sensor element 132 is sensitive to the x-magnetic field component Bx of the second magnetic field B2 and is insensitive, or substantially insensitive, to the first magnetic field B1, which does not have an x-magnetic field component Bx.

Alternatively, the second sensor element 132 may be an xMR sensor element that has a sensitivity axis aligned parallel with the x-axis (e.g., aligned parallel or antiparallel to the first direction) to be sensitive to the x-magnetic field component Bx of the first magnetic field B1.

The second sensor element 132 may be electrically coupled to the fourth lead 124 for providing the second sensor signal thereto for output from the chip package 114. Alternatively, the sensor circuit may be coupled to the fourth lead 124. The sensor circuit may receive the second sensor signal, process the second sensor signal to generate the second measurement signal, and provide the second measurement signal to the fourth lead 124 for output from the chip package 114. Thus, the second measurement signal is derived from the second sensor signal.

Due to a perpendicular arrangement of the first conductor structure 102 and the second conductor structure 104 in proximity to the magnetic field sensor 106 and due to a perpendicular arrangement of the first sensor plane of the first sensor element 103 and the second sensor plane of the second sensor element 132, the first sensor signal generated by the first sensor element 130 is independent from the second sensor signal generated by the second sensor element 132. This has the benefit that the magnetic field sensor 106 is capable of measuring the two currents I1 and I2 flowing through the two closely arranged first and second conductor structures 102 and 104 without magnetic cross-talk affecting the measurement of the two currents I1 and I2. Accordingly, the magnetic field sensor 106 provides accurate measurements of the two currents I1 and I2 in a power efficient manner.

As indicated above, FIG. 1C is provided merely as an example. Other examples are possible and may differ from what was described with regard to FIG. 1C. For example, in some implementations, an overlapped intersection of the first conductor structure 102 and second conductor structure 104 may be offset from the sensitive area 112 of the magnetic field sensor 106 or may be offset from the magnetic field sensor 106 itself to, for example, account for manufacturing tolerances or different manufacturing processes. In some implementations, the magnetic field sensor 106 may include three or more sensor elements to, for example, enable additional differential sensing or sensing redundancy. In some implementations, additional circuit components may be integrated within, or attached to, the current sensor arrangement 100 without deviating from the disclosure provided above.

Figure 1D:
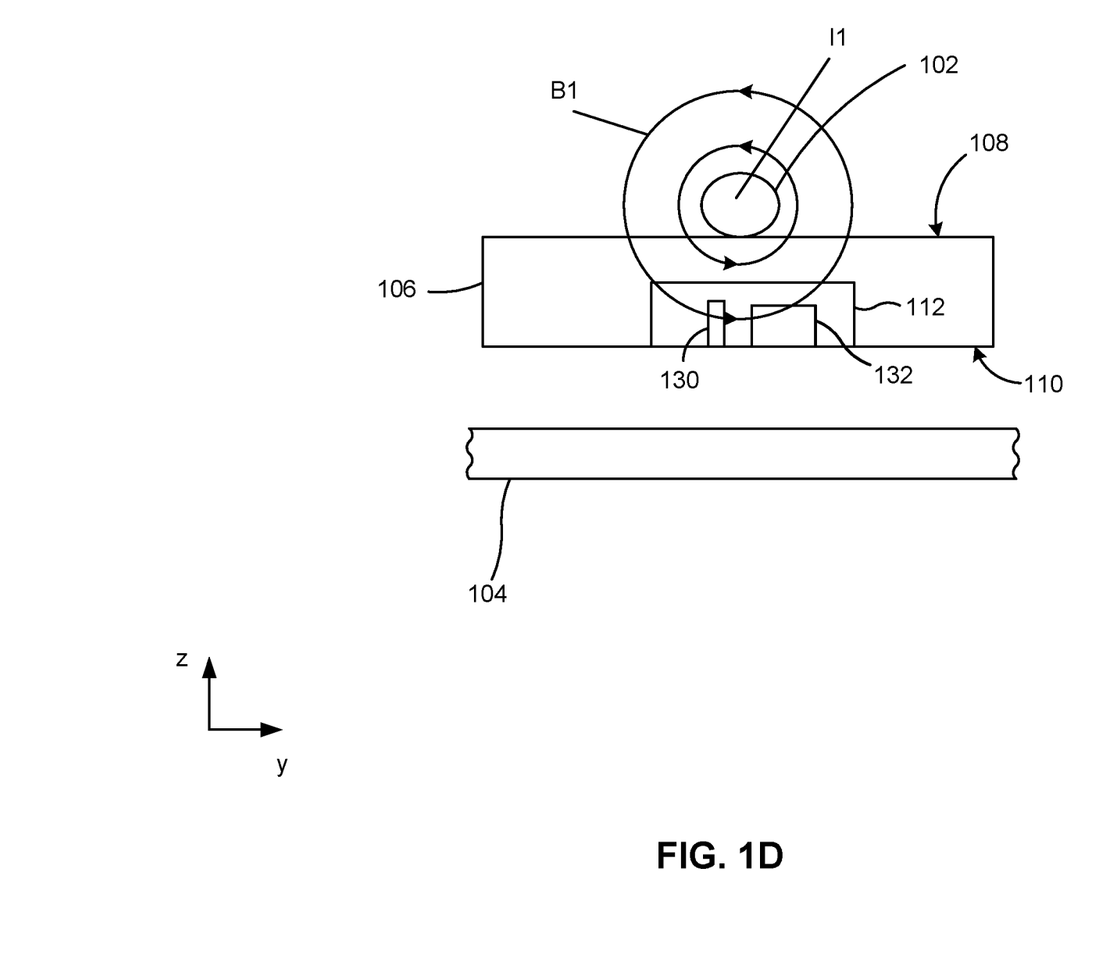
FIG. 1D is a cross-sectional view of the magnetic field sensor of the current sensor arrangement according to one or more implementations, where a cross-section of the magnetic field sensor is taken along cut line A-A shown in FIG. 1C.

FIG. 1D is a cross-sectional view of the magnetic field sensor 106 of the current sensor arrangement 100 according to one or more implementations, where a cross-section of the magnetic field sensor 106 is taken along cut line A-A shown in FIG. 1C. The cut line A-A extends parallel to the y-axis.

The first current I1 flowing through the first conductor structure 102 produces the first magnetic field B1 as shown. The first magnetic field B1 has a y-magnetic field component By and a z-magnetic field component Bz as the first magnetic field B1 encircles the first conductor structure 102. The first magnetic field B1 does not have an x-magnetic field component. Because the y-magnetic field component By of the first magnetic field B1 intersects perpendicular to the sensor plane of the first sensor element 130, the first sensor element 130 is sensitive to the y-magnetic field component By of the first magnetic field B1. Meanwhile, the second sensor element 132 is sensitive only to an x-magnetic field component Bx, which is not present in the first magnetic field B1. Accordingly, the first sensor element 130 generates the first sensor signal as a measure of the first current I1 without being affected by the second current I2. Moreover, the second sensor element 132 is insensitive to the first magnetic field B1.

As indicated above, FIG. 1D is provided merely as an example. Other examples are possible and may differ from what was described with regard to FIG. 1D. For example, in some implementations, an overlapped intersection of the first conductor structure 102 and second conductor structure 104 may be offset from the sensitive area 112 of the magnetic field sensor 106 or may be offset from the magnetic field sensor 106 itself to, for example, account for manufacturing tolerances or different manufacturing processes. In some implementations, the magnetic field sensor 106 may include three or more sensor elements to, for example, enable additional differential sensing or sensing redundancy. In some implementations, additional circuit components may be integrated within, or attached to, the current sensor arrangement 100 without deviating from the disclosure provided above.

Figure 1E:
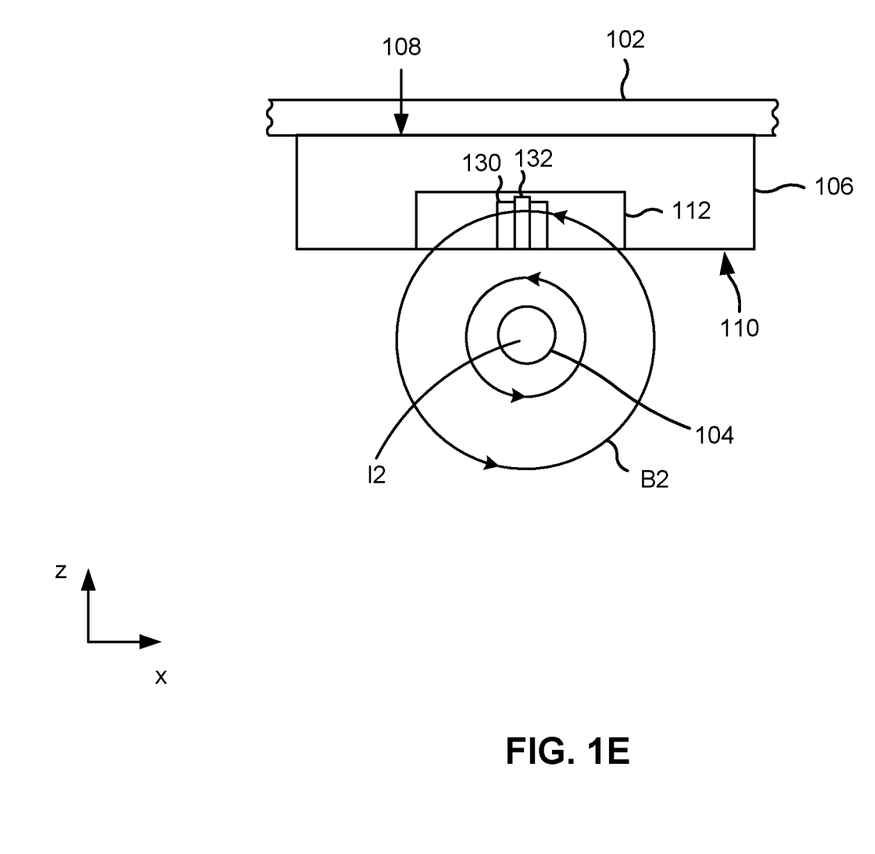
FIG. 1E is a cross-sectional view of the magnetic field sensor of the current sensor arrangement according to one or more implementations, where a cross-section of the magnetic field sensor is taken along cut line B-B shown in FIG. 1C.

FIG. 1E is a cross-sectional view of the magnetic field sensor 106 of the current sensor arrangement 100 according to one or more implementations, where a cross-section of the magnetic field sensor 106 is taken along cut line B-B shown in FIG. 1C. The cut line B-B extends parallel to the x-axis.

The second current I2 flowing through the second conductor structure 104 produces the second magnetic field B2 as shown. The second magnetic field B2 has an x-magnetic field component Bx and a z-magnetic field component Bz as the second magnetic field B2 encircles the second conductor structure 104. The second magnetic field B2 does not have a y-magnetic field component. Because the x-magnetic field component Bx of the second magnetic field B2 intersects perpendicular to the sensor plane of the second sensor element 132, the second sensor element 132 is sensitive to the x-magnetic field component Bx of the second magnetic field B2. Meanwhile, the first sensor element 130 is sensitive only to a y-magnetic field component By, which is not present in the second magnetic field B2. Accordingly, the second sensor element 132 generates the second sensor signal as a measure of the second current I2 without being affected by the first current I1. Moreover, the first sensor element 130 is insensitive to the second magnetic field B2.

As indicated above, FIG. 1E is provided merely as an example. Other examples are possible and may differ from what was described with regard to FIG. 1E. For example, in some implementations, an overlapped intersection of the first conductor structure 102 and second conductor structure 104 may be offset from the sensitive area 112 of the magnetic field sensor 106 or may be offset from the magnetic field sensor 106 itself to, for example, account for manufacturing tolerances or different manufacturing processes. In some implementations, the magnetic field sensor 106 may include three or more sensor elements to, for example, enable additional differential sensing or sensing redundancy. In some implementations, additional circuit components may be integrated within, or attached to, the current sensor arrangement 100 without deviating from the disclosure provided above.

Figure 2:
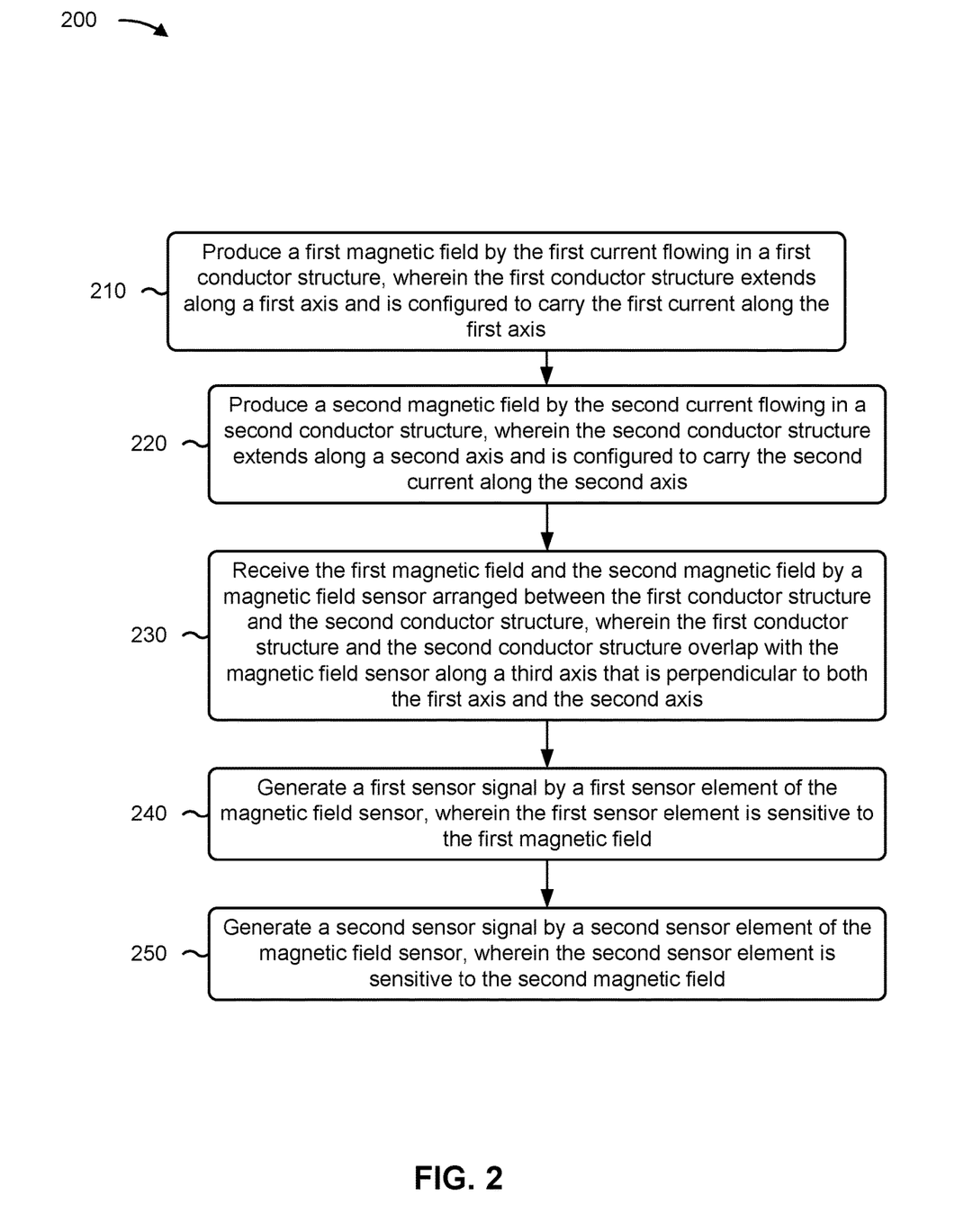
FIG. 2 is a flowchart of an example process 200 associated with dual current sensing.

FIG. 2 is a flowchart of an example process 200 associated with dual current sensing. In some implementations, one or more process blocks of FIG. 2 are performed by a device (e.g., the magnetic field sensor 106). In some implementations, one or more process blocks of FIG. 2 are performed by another device or a group of devices separate from or including the magnetic field sensor 106, such as one or more current generating devices. Additionally, or alternatively, one or more process blocks of FIG. 2 may be performed by one or more components of the magnetic field sensor 106, such as a processor, a memory, an input component, an output component, and/or communication component, or one or more components of the one or more current generating devices, such as a processor, a memory, an input component, an output component, and/or communication component.

As shown in FIG. 2, process 200 may include producing a first magnetic field by the first current flowing in a first conductor structure, wherein the first conductor structure extends along a first axis and is configured to carry the first current along the first axis (block 210). For example, a first current generating device may produce a first magnetic field by causing the first current to flow in a first conductor structure, wherein the first conductor structure extends along a first axis and is configured to carry the first current along the first axis, as described above.

As further shown in FIG. 2, process 200 may include producing a second magnetic field by the second current flowing in a second conductor structure, wherein the second conductor structure extends along a second axis and is configured to carry the second current along the second axis (block 220). For example, the first current generating device or a second current generating device may produce a second magnetic field by causing the second current to flow in a second conductor structure, wherein the second conductor structure extends along a second axis and is configured to carry the second current along the second axis, as described above.

As further shown in FIG. 2, process 200 may include receiving the first magnetic field and the second magnetic field by a magnetic field sensor arranged between the first conductor structure and the second conductor structure, wherein the first conductor structure and the second conductor structure overlap with the magnetic field sensor along a third axis that is perpendicular to both the first axis and the second axis (block 230). For example, the magnetic field sensor may receive the first magnetic field and the second magnetic field by a magnetic field sensor arranged between the first conductor structure and the second conductor structure, wherein the first conductor structure and the second conductor structure overlap with the magnetic field sensor along a third axis that is perpendicular to both the first axis and the second axis, as described above.

As further shown in FIG. 2, process 200 may include generating a first sensor signal by a first sensor element of the magnetic field sensor, wherein the first sensor element is sensitive to the first magnetic field (block 240).

As further shown in FIG. 2, process 200 may include generating a second sensor signal by a second sensor element of the magnetic field sensor, wherein the second sensor element is sensitive to the second magnetic field (block 250).

Process 200 may include additional implementations, such as any single implementation or any combination of implementations described below and/or in connection with one or more other processes described elsewhere herein.

Although FIG. 2 shows example blocks of process 200, in some implementations, process 200 includes additional blocks, fewer blocks, different blocks, or differently arranged blocks than those depicted in FIG. 2. Additionally, or alternatively, two or more of the blocks of process 200 may be performed in parallel.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein refers to any of the foregoing structures or any other structure suitable for implementation of the techniques described herein.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A current sensor arrangement, comprising:
  a first conductor structure extending in a first direction and configured to carry a first current along the first direction, wherein the first current produces a first magnetic field;
  a second conductor structure extending in a second direction perpendicular to the first direction, wherein the second conductor structure is configured to carry a second current along the second direction, and wherein the second current produces a second magnetic field; and
  a magnetic field sensor arranged between the first conductor structure and the second conductor structure and configured to receive the first magnetic field and the second magnetic field,
    wherein the first conductor structure and the second conductor structure overlap with the magnetic field sensor in a third direction that is perpendicular to both the first direction and the second direction, and
    wherein the magnetic field sensor comprises a first sensor element sensitive to the first magnetic field and configured to generate a first sensor signal based on the first magnetic field and the magnetic field sensor further comprises a second sensor element sensitive to the second magnetic field and configured to generate a second sensor signal based on the second magnetic field.

2. The current sensor arrangement of claim 1, wherein the first conductor structure and the second conductor structure overlap in the third direction with overlapping portions of the first conductor structure and the second conductor structure being arranged on an axis that bisects the magnetic field sensor.

3. The current sensor arrangement of claim 1, wherein:
  the first sensor element is substantially insensitive to the second magnetic field, and
  the second sensor element is substantially insensitive to the first magnetic field.

4. The current sensor arrangement of claim 1, wherein the first sensor signal is independent from the second sensor signal.

5. The current sensor arrangement of claim 1, wherein:
  the magnetic field sensor comprises a main surface and a body,
  the first sensor element is a first vertical Hall effect sensor element that extends from the main surface into the body of the magnetic field sensor, and
  the second sensor element is a second vertical Hall effect sensor element that extends from the main surface into the body of the magnetic field sensor.

6. The current sensor arrangement of claim 5, wherein:
  the first sensor element has a first sensitivity axis aligned parallel or antiparallel to the second direction such that the first sensor element is sensitive to the first magnetic field and substantially insensitive to the second magnetic field, and
  the second sensor element has a second sensitivity axis aligned parallel or antiparallel to the first direction such that the second sensor element is sensitive to the second magnetic field and substantially insensitive to the first magnetic field.

7. The current sensor arrangement of claim 1, further comprising:
  a chip package that houses the magnetic field sensor and comprises a lead frame,
    wherein the lead frame comprises a plurality of leads, including a first lead arranged at a first side of the chip package and a second lead arranged at a second side of the chip package that is opposite to the first side of the chip package, and
    wherein the first conductor structure comprises the first lead and the second lead.

8. The current sensor arrangement of claim 7, wherein:
  the lead frame comprises a die pad that is electrically coupled to the magnetic field sensor and to the plurality of leads, and
  the die pad comprises a conductive path that is electrically connected to the first lead and the second lead and the conductive path forms part of the first conductor structure.

9. The current sensor arrangement of claim 7, wherein:
  the plurality of leads comprises a third lead electrically coupled to the magnetic field sensor and configured to output the first sensor signal or a first measurement signal derived from the first sensor signal, and
  the plurality of leads comprises a fourth lead electrically coupled to the magnetic field sensor and configured to output the second sensor signal or a second measurement signal derived from the second sensor signal.

10. The current sensor arrangement of claim 7, wherein:
  the magnetic field sensor is a sensor chip comprising a first main surface, a second main surface arranged opposite to the first main surface, and a chip body that extends between the first main surface and the second main surface,
  the first conductor structure is arranged in closer proximity to the first main surface than to the second main surface, and
  the second conductor structure is arranged in closer proximity to the second main surface than to the first main surface.

11. The current sensor arrangement of claim 10, wherein the first sensor element and the second sensor element are arranged at the second main surface.

12. The current sensor arrangement of claim 7, wherein:
  the first conductor structure extends through the chip package in the first direction, and the second conductor structure is entirely external to the chip package and extends past the chip package in the second direction.

13. The current sensor arrangement of claim 12, wherein the second conductor structure is arranged in contact with the chip package.

14. The current sensor arrangement of claim 1, further comprising:
a chip package that houses the magnetic field sensor; and
a lead frame mechanically coupled to the chip package and electrically coupled to the magnetic field sensor,
wherein the lead frame comprises a plurality of leads, including a first lead arranged at a first side of the chip package and a second lead arranged at a second side of the chip package that is opposite to the first side of the chip package, and
wherein the first conductor structure comprises the first lead and the second lead.

15. The current sensor arrangement of claim 14, wherein:
the magnetic field sensor is a sensor chip comprising a first main surface, a second main surface arranged opposite to the first main surface, and a chip body that extends between the first main surface and the second main surface,
the first conductor structure is arranged in closer proximity to the first main surface than to the second main surface, and
the second conductor structure is arranged in closer proximity to the second main surface than to the first main surface.

16. The current sensor arrangement of claim 15, wherein:
the first conductor structure extends past the magnetic field sensor in the first direction, and
the second conductor structure is entirely external to the chip package and extends past the magnetic field sensor in the second direction.

17. The current sensor arrangement of claim 1, further comprising:
a chip package,
wherein the magnetic field sensor is a sensor chip, and
wherein the magnetic field sensor and at least a portion of the first conductor structure are integrated into the chip package.

18. The current sensor arrangement of claim 17, wherein:
the portion of the first conductor structure extends through the chip package in the first direction, and
the second conductor structure is entirely external to the chip package and extends past the chip package in the second direction.

19. The current sensor arrangement of claim 1, wherein the magnetic field sensor is configured to independently measure the first magnetic field and the second magnetic field.

20. The current sensor arrangement of claim 2, wherein the overlapping portions of the first conductor structure and the second conductor structure extend perpendicular to each other in the first direction and the second direction, respectively.

21. A current sensor arrangement, comprising:
a first conductor structure extending on a first axis and configured to carry a first current along the first axis, wherein the first current produces a first magnetic field;
a second conductor structure extending on a second axis perpendicular to the first axis, wherein the second conductor structure is configured to carry a second current along the second axis, and wherein the second current produces a second magnetic field; and
a magnetic field sensor arranged between the first conductor structure and the second conductor structure and configured to receive the first magnetic field and the second magnetic field,
wherein the first conductor structure and the second conductor structure overlap with the magnetic field sensor along a third axis that is perpendicular to both the first axis and the second axis, and
wherein the magnetic field sensor comprises a first sensor element sensitive to the first magnetic field and configured to generate a first sensor signal based on the first magnetic field and the magnetic field sensor further comprises a second sensor element sensitive to the second magnetic field and configured to generate a second sensor signal based on the second magnetic field.

22. A method for sensing a first current and a second current, the method comprising:
producing a first magnetic field by the first current flowing in a first conductor structure, wherein the first conductor structure extends along a first axis and is configured to carry the first current along the first axis;
producing a second magnetic field by the second current flowing in a second conductor structure, wherein the second conductor structure extends along a second axis and is configured to carry the second current along the second axis;
receiving the first magnetic field and the second magnetic field by a magnetic field sensor arranged between the first conductor structure and the second conductor structure, wherein the first conductor structure and the second conductor structure overlap with the magnetic field sensor along a third axis that is perpendicular to both the first axis and the second axis;
generating a first sensor signal by a first sensor element of the magnetic field sensor, wherein the first sensor element is sensitive to the first magnetic field; and
generating a second sensor signal by a second sensor element of the magnetic field sensor, wherein the second sensor element is sensitive to the second magnetic field.

* * * * *